(12) United States Patent
Davies et al.

(10) Patent No.: US 7,035,549 B2
(45) Date of Patent: *Apr. 25, 2006

(54) INTERCONNECTING CIRCUIT BOARDS USING FREE SPACE OPTICS

(75) Inventors: Bryan Russell Davies, Rosewater (AU); James P. Dunn, Sandwich, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/639,886

(22) Filed: Aug. 13, 2003

(65) Prior Publication Data

US 2005/0259993 A1    Nov. 24, 2005

Related U.S. Application Data

(62) Division of application No. 09/514,140, filed on Feb. 28, 2000, now Pat. No. 6,650,844.

(51) Int. Cl.
*H04B 10/00* (2006.01)
*H04J 12/02* (2006.01)

(52) U.S. Cl. .......................... 398/164; 398/48; 398/86; 398/129

(58) Field of Classification Search ................. 398/45, 398/48, 50, 55–56, 96, 118, 128, 130, 164, 398/86, 129; 385/17; 257/81–82; 250/559.11
See application file for complete search history.

(56) References Cited

U.S. PATENT DOCUMENTS

| | | | | |
|---|---|---|---|---|
| 4,720,634 A | * | 1/1988 | D'Auria et al. | 250/551 |
| 4,850,044 A | * | 7/1989 | Block et al. | 398/118 |
| 4,856,091 A | * | 8/1989 | Taska | 398/166 |
| 5,018,131 A | * | 5/1991 | Shah et al. | 398/49 |
| 5,245,680 A | * | 9/1993 | Sauter | 385/24 |
| 5,268,973 A | * | 12/1993 | Jenevein | 385/14 |
| 5,362,961 A | * | 11/1994 | Hamanaka | 250/216 |
| 5,500,523 A | * | 3/1996 | Hamanaka | 250/216 |
| 5,818,618 A | * | 10/1998 | Eastmond | 398/164 |
| 5,822,096 A | * | 10/1998 | Redmond et al. | 398/86 |
| 5,923,451 A | * | 7/1999 | Karstensen et al. | 398/164 |

(Continued)

*Primary Examiner*—Leslie Pascal (57) ABSTRACT

In an electronic device, plural circuit boards are plugged into respective connectors, or sockets, in a common backplane circuit board. The backplane maintains the flat circuit boards in fixed relation to one another. Each circuit board is provided with a respective optical transmitter and/or receiver to allow for the transmission of (typically digital) information via a high speed carrier in a light beam through unobstructed free space between the circuit boards. The circuit boards may also be provided with optical splitters and/or combiners as well as apertures to permit light signals to pass through the board's substrate to allow for communication between plural circuit boards. The circuit boards may further include small lenses and/or opaque elements to provide an optical path having selected physical characteristics. The light signals are transmitted through free space between the circuit boards in the connection of a circuit board in the electronic device is determined by the alignment of its optical transmitter and/or receiver to make the connection. With each circuit board typically "locked" into place in the backplane by means of latches, each circuit board is sized and configured so that when in position, the receivers and transmitters of the circuit boards are aligned so as to define a common signal path. Each circuit board is designed to determine in which slot in the backplane it has been inserted to permit the circuit boards to be used in a daisy-chain approach, allowing any circuit board to communicate with any other circuit board.

7 Claims, 5 Drawing Sheets

U.S. PATENT DOCUMENTS

| | | | | |
|---|---|---|---|---|
| 5,987,198 | A * | 11/1999 | Hirota et al. | 385/24 |
| 6,038,355 | A * | 3/2000 | Bishop | 385/14 |
| 6,055,099 | A * | 4/2000 | Webb | 359/435 |
| 6,317,242 | B1 * | 11/2001 | Ozeki et al. | 398/164 |
| 6,330,093 | B1 * | 12/2001 | Eller et al. | 398/164 |
| 6,374,020 | B1 * | 4/2002 | Paniccia | 385/47 |
| 6,628,441 | B1 * | 9/2003 | Staiger | 398/164 |
| 6,650,844 | B1 * | 11/2003 | Davies et al. | 398/164 |

* cited by examiner

INTERCONNECTING CIRCUIT BOARDS USING FREE SPACE OPTICS

This application is a divisional of U.S. application Ser. No. 09/514,140 filed Feb. 28, 2000 now U.S. Pat. No. 6,650,844.

TECHNICAL FIELD

This invention relates generally to electronic circuit board design for systems with multiple circuit boards which are connected to and maintained in common alignment by a backplane circuit board. More particularly, this invention is directed to an arrangement that allows the circuit boards to communicate digital data between one another without physical connection between the circuit boards, and without any modification of or design impact on the backplane circuit board used to host the circuit boards.

BACKGROUND OF THE INVENTION

Today many electronic systems, including computer systems, physically consist of several circuit boards, or cards, that plug into a common "backplane" circuit board. The circuit boards are usually multi-layer printed circuit ("PC") boards with discrete and integrated components that are soldered or otherwise physically attached to and-in contact with "traces" which are conducting paths connecting the devices to form the electronic circuit. The backplane is usually another PC board with sockets to hold the multiple circuit boards, and which has conducting paths connecting the pins in the sockets, and thus the circuitry on the circuit boards with one another. The assembly of circuit boards that plug into a backplane is often held in an equipment shelf that uses slots or rails to guide the circuit boards and keep each aligned with its associated socket on the backplane during insertion or removal.

One of the problems with this configuration is that the backplane traces and thus the connections between the circuit boards are fixed in hardware. Once the backplane has been designed, there are limits on the types of changes that can be made to the signal paths between the circuit boards. If the system designer desires additional bandwidth or types of connectivity between circuit boards, and these additional accommodations are not supported by the backplane configuration, the designer must resort to additional hardware or to redesigning the backplane to satisfy the new need. Such remedies may include a fiber-optic link between the circuit boards, paddleboards that connect to wire-wrap pins on the reverse side of the backplane, or ribbon cables that connect to sockets on the edges of the boards.

Redesigning the backplane is undesirable because it increases the number of proprietary-specific backplane configurations thus reducing circuit board interchangeability. Specialized backplanes require specialized boards to fit those backplanes, and this means that neither the backplane nor the boards themselves can be purchased "off the shelf" from third party vendors. Redesigining hardware also slows the product development cycle and increases the time between product concept and market availability.

Adding hardware links between circuit boards in a shelf makes assembly and maintenance-of the finished product much more complex. In order to replace a board in a shelf, all connections must be removed before the circuit board itself can be removed. The connectors between the circuit boards add additional points of failure, and reduce the reliability of the boards and thus the system. Replacing a faulty circuit board in the shelf takes longer when there are cables or fibers connected to the board that must be manipulated, increasing the time required to repair a fault. And sometimes the links between circuit boards may be "daisy chained" so that removing the link from any board may isolate other unrelated boards from one another.

If a specific hardware link is created between circuit boards, either through conductors in the backplane or using cables or fibers connecting the boards, the characteristics of that link become quite fixed in nature. It is generally difficult to change the type of data, bandwidth, or function of a hardware link simply because the hardware is designed to provide a path for a very specific type of data, bandwidth, or function. The hardware connection thus typically reduces the flexibility of the design of the circuit board and the system. As an example, if a two-conductor Ethernet connection is provided between two circuit boards in an existing configuration, it is very difficult to redesign the hardware connection to instead provide a high-speed mate-update bus between the two circuit boards. An additional hardware path would be needed to provide this function. Thus, the physical parameters and characteristics of a circuit board connection affects the functions available in that connection.

What is needed is a generic, flexible connection technology between circuit boards in a backplane that provides a data path between the boards, which is independent of the backplane, and which requires no physical connection between the boards. Accordingly, it is the object of the present invention to provide a data path between circuit boards in a backplane with these characteristics.

SUMMARY OF THE INVENTION

The invention uses free space optics to provide a communication path between circuit boards installed in a backplane in an equipment shelf. One or more circuit boards in the shelf have one or more optical transmitters that emit a beam of light which may be in the form of a laser beam. One or more circuit boards in the shelf also have an optical receiver for receiving light emitted from the transmitter on one or more of the other boards. Circuit boards may also be provided with optical splitters and optical combiners, and may have apertures drilled through the boards for allowing light signals to pass through. Circuit boards may also have small lenses and/or opaque pieces of material to change the physical characteristics of the optical path. The optical signal transmitted through unobstructed free space between circuit boards is used as a high-speed carrier of (typically digital) information between the boards. The present invention can be compared to a fiber optic carrier system, except that it does not use fibers to carry the signals between the circuit boards. Rather, the present invention transmits signals between circuit boards through free space, depending on the alignment of transmitters and receivers to make the connection. Since circuit boards are typically "locked" into place in the equipment shelf using latches, the boards are designed so that when they are installed, the receivers and transmitters on the boards are aligned and a signal path is established. When a circuit board is removed, all connections to and from that board are automatically broken.

In one embodiment of the present invention, a pair of circuit boards are arranged in spaced, parallel alignment connected to a backplane circuit board. A first circuit board includes an optical transmitter, while the second circuit board includes an optical receiver. The optical transmitter directs a light beam onto the optical receiver to permit communication between electronic circuitry on the two circuit boards. The optical transmitter is preferably a laser. The second circuit board may also be provided with an optical transmitter, while the first circuit board is also provided with an optical receiver. The optical transmitter on the second circuit board directs a second light beam onto the optical receiver on the first circuit board to allow for bi-directional optical communication between the two circuit boards. A second, opposed side of either the first or second circuit boards may similarly be provided with an optical transmitter and receiver pair for communicating with a similarly configured third circuit board. This arrangement allows a pair of adjacent circuit boards to communicate together, or the circuit boards may be used in a daisy-chain approach that allows any circuit board to communicate with any other circuit board via one or more intermediate circuit boards. In this latter embodiment, the circuit boards may be designed so as to be capable of determining in which slot in an equipment shelf the circuit board has been inserted to permit the daisy-chain approach.

Another embodiment of the invention contemplates a circuit board inserted in an end slot in an equipment shelf which serves as a "hub". This end-most circuit board includes an optical transmitter. Other circuit boards are inserted in the equipment shelf and are arranged in a spaced, aligned array. These latter circuit boards are each provided with an aperture which permit a light beam emitted by the optical transmitter on the end-most circuit board to pass through the other circuit boards. Each of the latter circuit boards further includes an optical splitter disposed adjacent the aperture in the board and aligned so as to receive a light beam. This allows the hub circuit board to provide information to each of the remaining circuit boards. This embodiment further contemplates the hub circuit board being provided with only an optical receiver. An optical transmitter on each of the other parallel, spaced circuit boards directs light beams through apertures in each of these latter circuit boards onto the optical receiver on the hub circuit board. Disposed adjacent each aperture in the latter circuit boards is an optical combiner which allows the signals from all of the circuit boards "upstream" to be combined to form a composite signal which is directed onto the optical receiver of the hub circuit board. The optical signal of each circuit board distinguishes it from the remaining circuit boards, such as on the basis of frequency or data format, to permit the optical receiver to determine which circuit board transmitted a received signal. This configuration can be combined with the previously described configuration to provide an optical data bus whereby each circuit board can receive information transmitted by a bus circuit board, and each board can also transmit information back to the bus circuit board.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
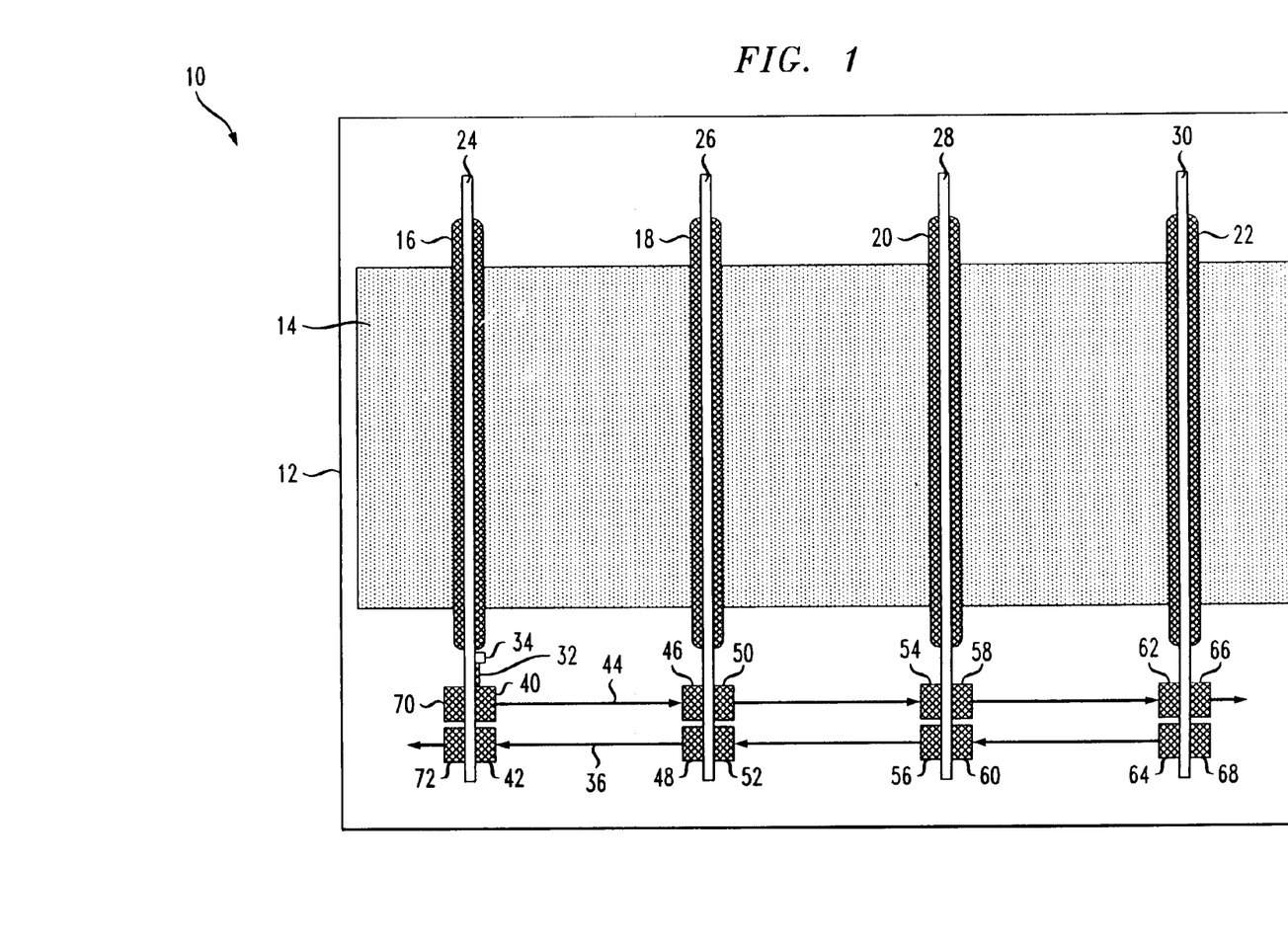
FIG. 1 is a simplified schematic diagram of a first embodiment of the present invention, wherein each circuit board is provided with at least one pair of an optical receiver and an optical transmitter.

Referring to FIG. 1, there is shown a simplified schematic diagram of one embodiment of an optically interconnected circuit board arrangement 10 in accordance with the present invention. The optically interconnected circuit board arrangement 10 includes an equipment shelf 12 having a backplane circuit board 14. The backplane circuit board 14 is provided with plural spaced connectors for electrical connection to first, second, third and fourth circuit boards 24, 26, 28 and 30. The spaced connectors on the backplane circuit board 14, which are not shown in the figure for simplicity, are adapted for electrical coupling to an edge connector on each of the circuit boards. Disposed adjacent each respective connector on the backplane circuit board 14 are first, second, third and fourth guides 16, 18, 20 and 22. Each of the guides is in the form of a pair of spaced rails which are adapted for receiving and guiding a respective circuit board into intimate contact with an associated backplane connector. Thus, the first, second, third and fourth guides 16, 18, 20 and 22 are respectively adapted to receive in tight fitting engagement the first, second, third and fourth circuit boards 24, 26, 28 and 30. When inserted between a pair of spaced rails in a sliding manner, an edge connector, or connectors, on each circuit board may be positioned in intimate contact with an electrical connector on the backplane circuit board 14. The spaced guides maintain the circuit boards in parallel, spaced alignment on the backplane circuit board 14.

Disposed on a first surface of the first circuit board 24 are an optical transmitter 40 and an optical receiver 42. Optical transmitter 40 is connected by means of one or more conductors 32 to circuitry 34 on the surface of the first circuit board 24. For simplicity, the circuitry 34 on the first circuit board 24 is shown as a single block, although such circuitry would typically be comprised of a large number of interconnected electrical components and devices. Optical receiver 42 is similarly connected to circuitry on the first circuit board 24, but this is not shown in the figure for simplicity. Similarly, the other optical transmitters and receivers shown in the various figures and described in the following paragraph are connected to electronic circuitry on its associated circuit board, although this is not shown in FIG. 1 and the remaining figures for the sake of simplicity. Disposed on a second, opposed surface of the first circuit board 24 are an optical receiver 70 and optical transmitter 72. Each of the optical transmitters described herein is preferably a laser, but may be any light source that emits a well-defined light beam. Similarly, the optical receivers contemplated for use in the present invention may be a conventional photo detector.

Disposed on a first surface of the second circuit board 26 are a optical receiver 46 and optical transmitter 48. Optical receiver 46 is aligned with the optical transmitter 40 on the first circuit board 24 and receives a light beam 44 emitted therefrom. Similarly, the optical receiver 42 on the first circuit board 24 is aligned with the optical transmitter 48 on the second circuit board 26 and receives a light beam 36 emitted therefrom.

Disposed on a second, opposed surface of the second circuit board 26 are an optical transmitter 50 and an optical receiver 52 which are respectively aligned with an optical receiver 54 and an optical transmitter 56 on a third circuit board 28. Disposed on a second, opposed surface of the third circuit board 28 are an optical transmitter 58 and an optical receiver 60 which are respectively aligned with an optical receiver 62 and an optical transmitter 64 on a fourth circuit board 30. Disposed on a second, opposed surface of the fourth circuit board 30 are an optical transmitter 66 and an optical receiver 68. The aligned pairs of optical transmitters and receivers on adjacent circuit boards permit these circuit boards to communicate with each other in a bi-directional manner via a pair of light beams. The light beams are transmitted through unobstructed free space between the circuit boards. The receivers and transmitters for each of these circuit boards are aligned with one another by locating the transmitters and receivers in the same position on the circuit board. Alignment between an optical transmitter and its associated receiver is critical, except where frequency-specific optical signals are employed. Increasing light beam dispersion reduces the alignment problems. When the first circuit board 24 is inserted into the equipment shelf 12 and is activated, its transmitter 40 begins attempting to make contact with the neighboring circuit board. If no return signal is received, circuitry on the first circuit board determines that it has no neighboring circuit board. When the second circuit board 26 is inserted in to the equipment shelf 12 and is activated, its optical transmitters 50 and 48 begin transmitting carrier signals and its receivers 46 and 52 attempt to detect light beams emitted by neighboring circuit boards.

As shown in FIG. 1, each of the circuit boards installed in the equipment shelf 12 has established a bi-directional optical communication link with one or more adjacent circuit boards. Subsequent insertions and activations of circuit boards in the equipment shelf 12 may break the communication path between circuit boards already installed, with new communication links established with the new inserted circuit board. As circuit boards are added to equipment shelf 12, communication paths between the circuit boards are formed dynamically, with each circuit board communicating only with one other circuit board or with its two immediately adjacent neighbors. The end-most first and fourth circuit boards 24, 30 communicate only with the second and third circuit boards 26, 28, respectively. Because the circuit boards typically include circuitry which allows the circuit board to determine which slot, or connector, in the backplane circuit board 14 it has been inserted into, the circuit boards may be used in a daisy-chain approach allowing any circuit board to send a message to any other circuit board in an array of circuit boards.

Figure 2:
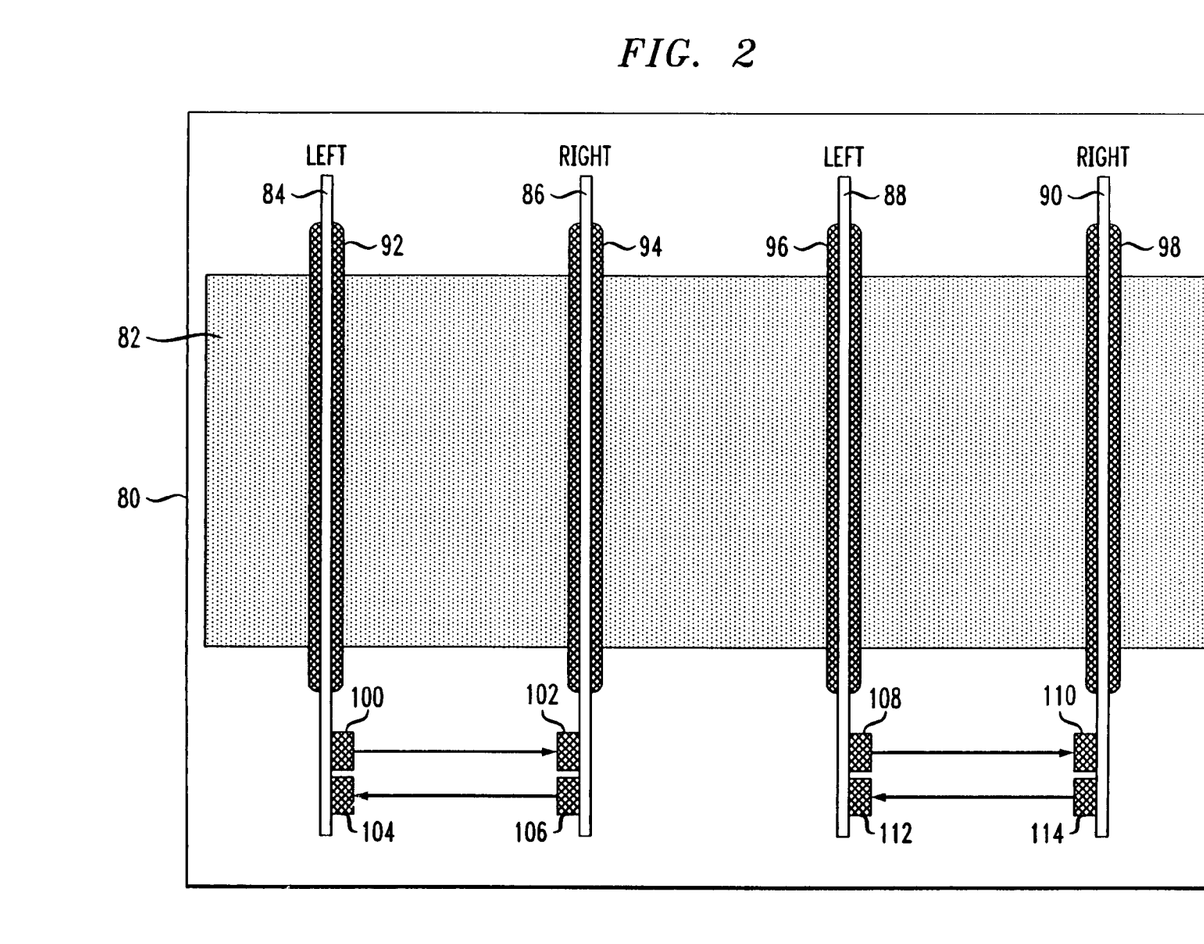
FIG. 2 is a simplified schematic diagram of another embodiment of the present invention, wherein adjacent circuit boards are each provided with an optical transmitter and receiver for communicating with each other bi-directionally.

Referring to FIG. 2, there is shown another embodiment of an arrangement for interconnecting circuit boards using free space optics in accordance with the present invention. As in the previously described embodiment, four circuit boards 84, 86, 88 and 90 are inserted in an equipment shelf 80 and are connected to a respective connector in a backplane circuit board 82. The four circuit boards 84, 86, 88 and 90 are attached to the backplane circuit board 82 by first, second, third and fourth guides 92, 94, 96 and 98, respectively. The four circuit boards are of two distinct types, i.e., left and right, and are arranged for communication purposes in pairs. Thus, disposed on a first surface of the first circuit board 84 are an optical transmitter 100 and an optical receiver 104. Disposed on a facing surface of the second circuit board 86 are an optical receiver 102 and an optical transmitter 106. Similarly, disposed on a first surface of the third circuit board 88 are an optical transmitter 108 and an optical receiver 112. Disposed on a facing surface of the fourth circuit board 90 are an optical receiver 110 and an optical transmitter 120. Pairs of optical transmitters and receiver on adjacent left and right circuit boards are in common alignment for communicating by means of a light beam transmitted between the circuit boards. If one of the paired circuit boards is not installed in the equipment shelf 80, then the light beam emitted by the optical transmitter of the installed circuit board is incident upon either the side of the equipment shelf 80 or on the surface of the adjacent circuit board which does not have a receiver thereon. The configuration of paired, communicating circuit boards shown in FIG. 2 is well suited for providing a mate-update communications path between two circuit boards without requiring backplane hardware support for the pairs of communicating circuit boards.

Figure 3:
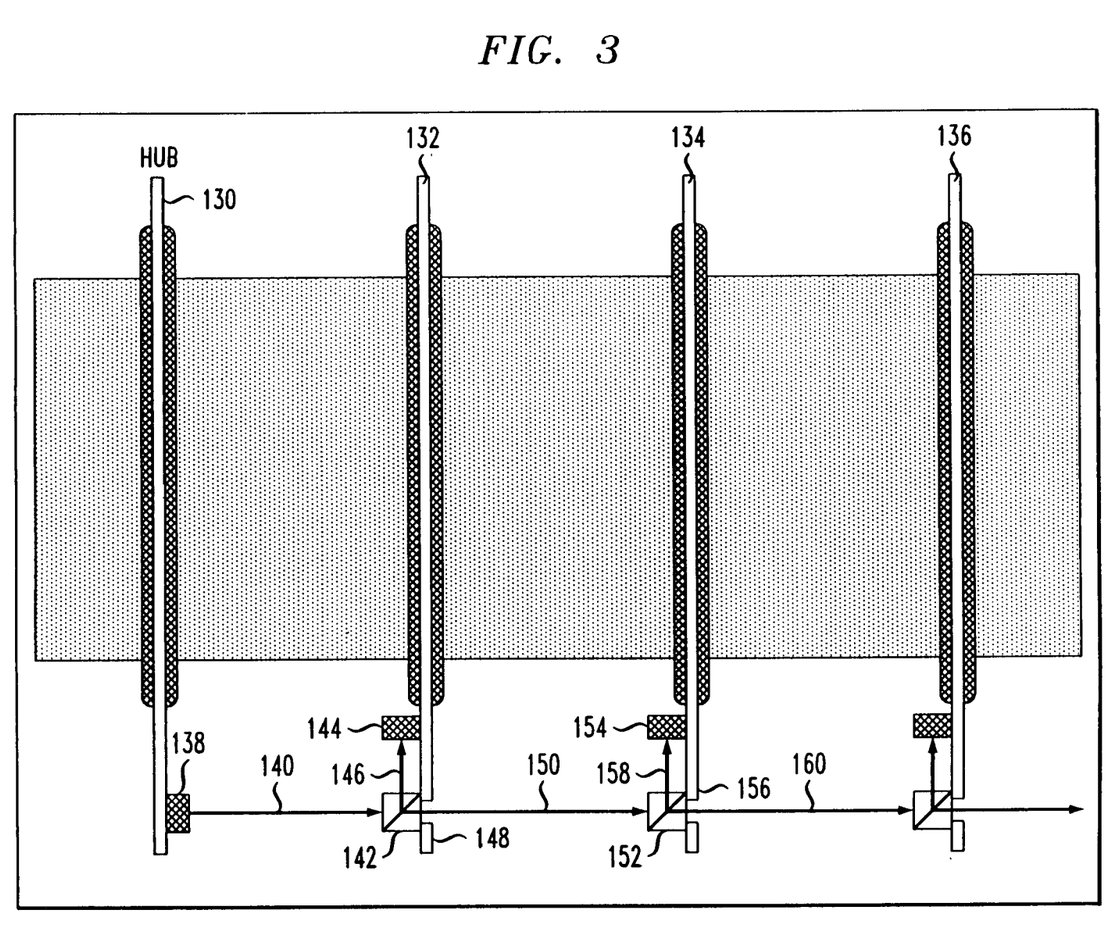
FIG. 3 is a simplified schematic diagram of another embodiment of the present invention, wherein some of the circuit boards are provided with an aperture for passing the light beam as well as an optical splitter for allowing the circuit boards to communicate individually with other circuit boards.

Referring to FIG. 3, there is shown another embodiment of an arrangement for interconnecting circuit boards using free space optics in accordance with the present invention. As in the previously described embodiment, the first, second, third and fourth circuit boards 130, 132, 134 and 136 are coupled to connectors in a backplane circuit board mounted in an equipment shelf. The first circuit board serves as a "hub" in that it only incorporates an optical transmitter 138. Each of the three remaining circuit boards 132, 134 and 136 is provided with an optical beam passing aperture and an optical splitter disposed adjacent the aperture in the circuit board. Thus, the second and third circuit boards 132, 134 are respectively provided with the combination of aperture 148 and optical splitter 142 and the combination of aperture 156 and optical splitter 152. The second and third circuit boards 132, 134 are further provided with respective optical receivers 144 and 154. The fourth circuit board 136 is similarly configured. Optical splitter 142 on the second circuit board 132 divides a light beam 140 emitted by optical transmitter 138 on the first circuit board 130 into a partially reflected beam 146 and a partially transmitted beam 150. The partially transmitted beam 150 is directed through the aperture 148 in the second circuit board 132 and onto a second optical splitter 152 disposed on the third circuit board 134. The second optical splitter 152 divides the light beam 150 into a partially reflected beam 158 and a partially transmitted beam 160 which is directed onto a similar optical splitter on the fourth circuit board 136. The partially reflected beams 146 and 158 are directed to the optical receivers 144 and 154, respectively, on the second and third circuit boards 132, 134. The combination of a beam passing aperture and its optical splitter allows the light beam emitted by the optical transmitter 138 on the first circuit board 130 to be split multiple times, i.e., to be split into partially reflected and transmitted beams each time it transits an aligned circuit board. The use of the optical splitters and circuit board apertures eliminates the requirement for additional optical transmitters. The light beam 140 emitted by transmitter 138 includes information for each of the second, third and fourth circuit boards 132, 134 and 136 and would preferably include a protocol which allows for addressing messages in the light beam to a specific circuit board.

Figure 4:
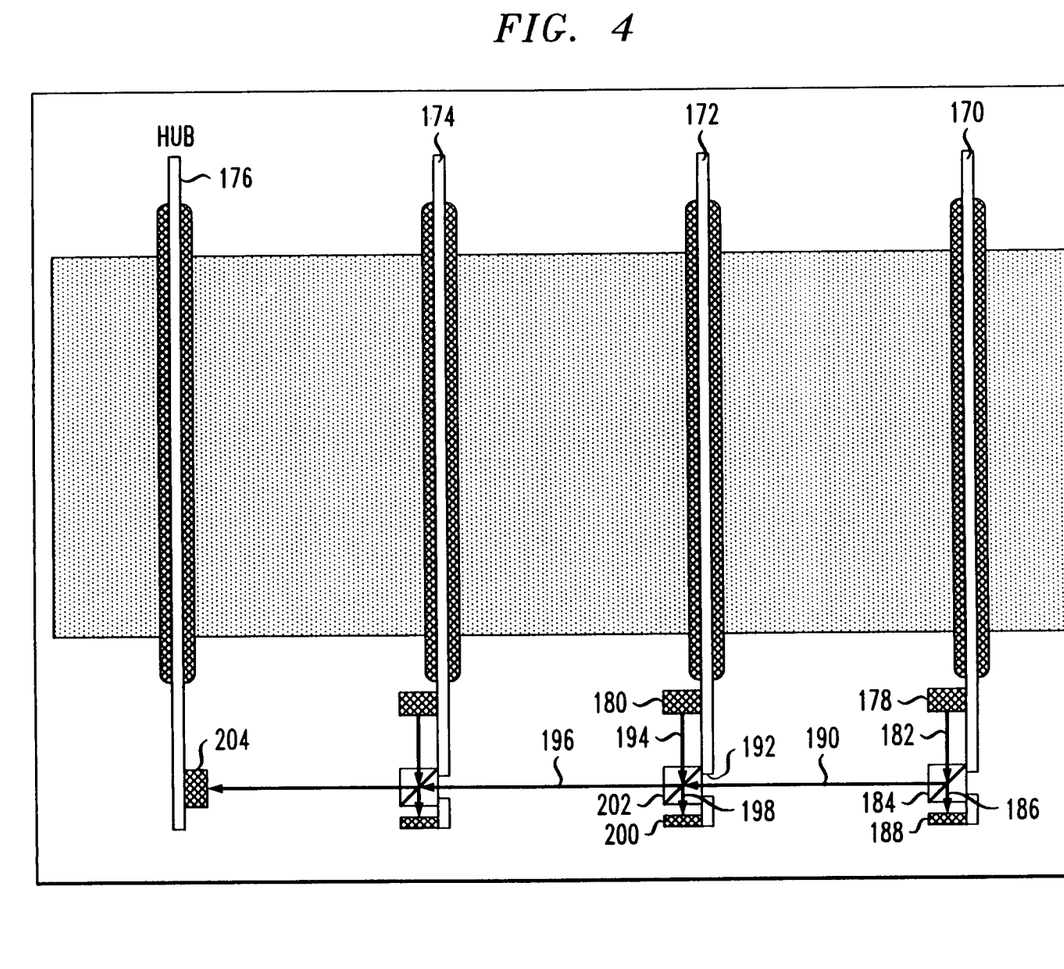
FIG. 4 is a simplified schematic diagram of still another embodiment of the present invention, wherein the circuit boards are provided with a light beam passing aperture, an optical splitter/combiner, and an optical transmitter and receiver pair to permit the circuit boards to communicate individually with other circuit boards as well as with a "hub" circuit board installed at the end of the equipment rack.

Referring to FIG. 4, there is shown yet another arrangement for interconnecting circuit boards using free space optics in accordance with the principles of the present invention. The embodiment shown in FIG. 4 includes first, second, third and fourth circuit boards 170, 172, 174 and 176. The fourth circuit board 176 includes only an optical receiver 204 and serves as a "hub". The first and second circuit boards 170, 172 include respective optical transmitters 178 and 180 and optical receivers 188 and 200. The first and second circuit boards 170, 172 further include the combination of an aperture and an aligned optical combiner/splitter. Optical transmitter 178 directs a light beam 182 onto optical combiner/splitter 184 which divides the incident light beam into a partially reflected beam 190 and a partially transmitted beam 186. The partially transmitted beam 186 is directed to the optical receiver 188 on the first circuit board 170. The partially reflected beam 190 is directed through aperture 192 in the second circuit board 172 and onto an optical combiner/splitter 202 on the second circuit board. A light beam 194 emitted by the optical transmitter 180 on the second circuit board 172 is also directed onto the optical combiner/splitter 202. The optical combiner/splitter 202 divides the incident light beam 194 into a partially reflected beam 196 and a partially transmitted beam 198. The partially transmitted beam 198 is directed onto an optical receiver 200 on the second circuit board 172. The light beam 196 is thus a combination of the light beam 190 emitted by the optical transmitter 178 on the first circuit board 170 and the light beam 194 emitted by the optical transmitter 180 on the second circuit board 172. A similar configuration is provided on the third circuit board 174 for allowing an optical beam emitted by that circuit board to be combined with the optical beams of the first and second circuit boards 170, 172, with the combined light beam provided to the optical receiver 204 on the hub circuit board 176. Additional circuit boards may be installed in the equipment shelf in positions to the right of the first circuit board 170, as viewed in the figure, to provide even more components to the composite light beam incident on the optical receiver 204 of the fourth hub circuit board 176, although these additional circuit boards are not shown in the figure for the sake of simplicity. Each optical combiner/splitter shown in FIG. 4 combines the signal from all circuit boards "upstream" from itself with the signal emitted by the circuit board on which the optical combiner/splitter is positioned to create a composite signal that is eventually received by the optical receiver 204 of the fourth hub circuit board 176. Each circuit board may be assigned a different frequency light transmitter, i.e., a different frequency laser, and the signals from the various circuit boards may be multiplexed using the optical combiner/splitter to form a composite Wave Division Multiplexed (WDM) signal. The optical receiver 204 on the fourth hub circuit board 176 is capable of receiving this WDM signal and determining which circuit board transmitted the signal by the signal's frequency, or by circuit board identifier data provided in the data stream of the composite light beam. The data stream emitted by each circuit board is controlled by electronic circuitry on the board. The arrangement for interconnecting circuit boards using free space optics shown in FIG. 4 could be combined with the arrangement shown in FIG. 3 to provide a bi-directional "optical bus" whereby each circuit board would be capable of receiving information transmitted by a bus, or hub, circuit board and each circuit board could also transmit information back to the bus, or hub, circuit board.

Figure 5:
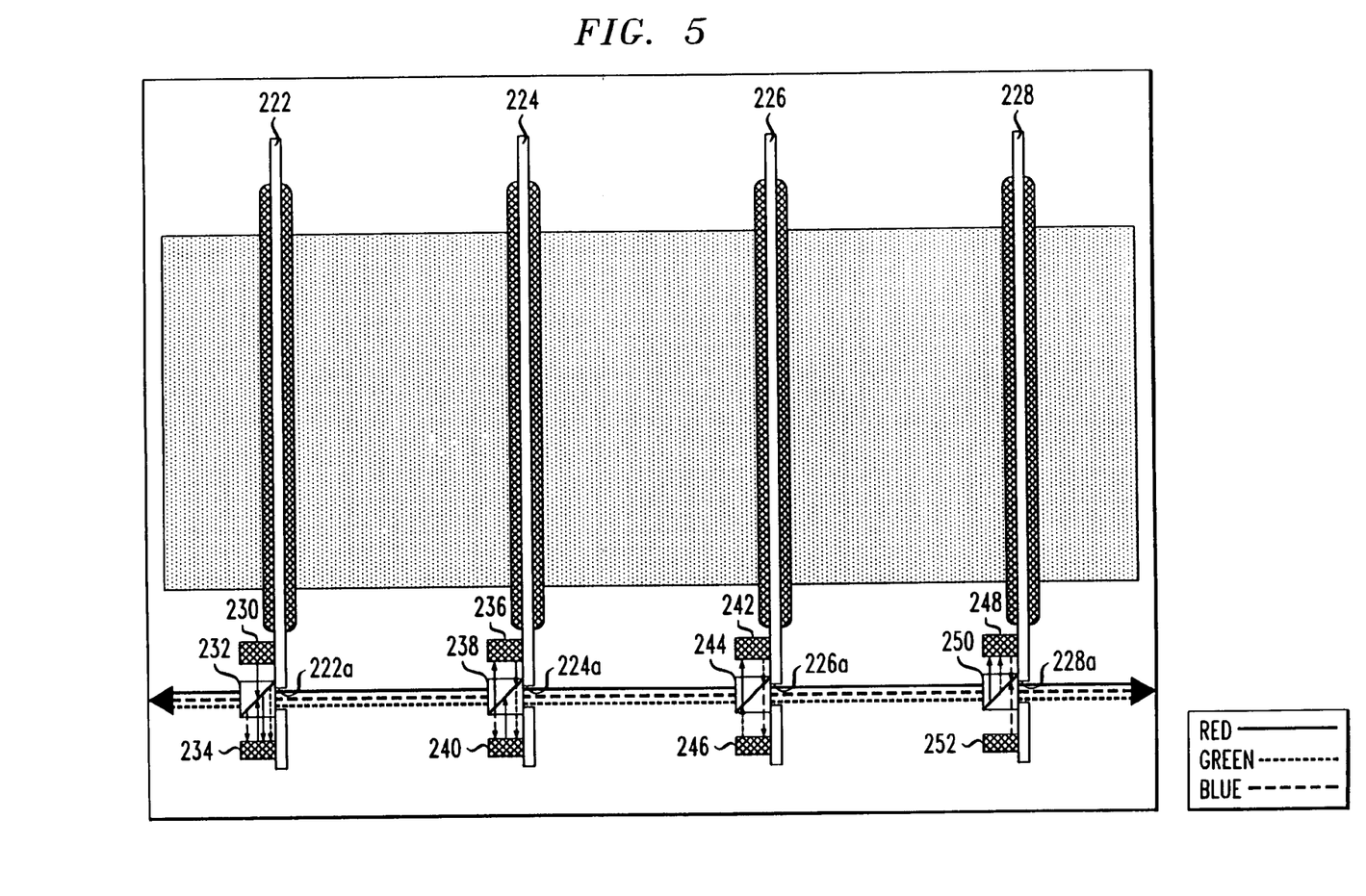
FIG. 5 is a simplified schematic diagram of still another embodiment of the present invention, wherein the circuit boards are provided with a beam passing aperture, an optical splitter/combiner, and an optical transmitter and receiver pair, where the optical transmitters are each provided with selected light emitting color diodes for emitting a light beam with a selected color to permit each circuit board to selectively communicate with one or more other circuit boards by means of an optical data bus.

Referring to FIG. 5, there is shown yet another embodiment of an arrangement for interconnecting circuit boards using free space optics in accordance with the present invention. As in the previously described embodiment, first, second, third and fourth circuit boards 222, 224, 226 and 228 are each connected to a respective connector on a backplane circuit board disposed in an equipment shelf. Each of the circuit boards is provided with a pair of optical transmitters/receivers. Each of the optical transmitters/receivers emits a light beam comprised of one of three selected colors and is capable of receiving all three color light beams. Thus, the first circuit board has attached thereto a pair of optical transmitter/receivers 230 and 234 which each emit a red light beam. The second circuit board 224 is also provided with a pair of optical transmitters/receivers 236 and 240 also capable of emitting red light beams. The third circuit board 226 is provided with a pair of optical transmitters/receivers 242 and 246 which are each adapted for emitting a green light beam. Finally, the fourth circuit board 228 is provided with an optical transmitter/receiver 248 and an optical transmitter 252 which are each adapted for emitting a blue light beam. Again, each of the aforementioned transmitters/receivers is capable of receiving light beams comprised of the three colors of red, green or blue.

Each of the circuit boards is also provided with a beam passing aperture and an optical combiner/splitter aligned with the circuit board's beam passing aperture. Thus, the first circuit board 222 is provided with a beam passing aperture 222a and an optical combiner/splitter 232. Similarly, the second and third circuit boards 224, 226 are respectively provided with apertures 224a and 226a and optical combiners/splitters 238 and 244. Finally, the fourth circuit board 228 is provided with beam passing aperture 228a and optical combiner/splitter 250.

Each of the transmitters/receivers is aligned with the optical combiner/splitter on its associated circuit board to either receive a partially reflected light beam from the optical combiner/splitter or to direct a color light beam onto the optical combiner/splitter. In the figure, the red light beam is shown as a solid line, the green light beam is shown as a dotted line, and the blue light beam is shown as a dashed line. As shown in the figure, the red transmitters/receivers 230 and 234 direct a red beam onto optical combiner/splitter 232. Similarly, on the second circuit board 224, red transmitters/receivers 236, 240 direct red beams onto optical combiner/splitter 238. On the third circuit board 226, green transmitters/receivers 242, 246 direct green beams onto optical combiner/splitter 244. Finally, blue transmitters/receivers 248 and 252 direct blue beams onto optical combiner/splitter 250. The color, or frequency selective signals employed in this embodiment of the invention permit identifying the circuit board which emits the signal at the assigned frequency. The selective assigning of transmitted optical signals eliminates the requirement of an addressing protocol and this reduces the signal processing overhead of the circuit boards. On the other hand, the use of multiple frequencies in the laser beams in combination with an addressing protocol permits the replacement of a broken diode laser operating at a given frequency with a multi-frequency laser without waiting for another laser operating at the given frequency.

The composite light beam transmitted through the aligned apertures in the circuit boards includes all three colors of red, green and blue. Each transmitter/receiver on the circuit boards introduces a beam of one of the three colors into the composite beam transmitted through the aligned circuit board apertures. Each of the transmitters/receivers is adapted to receive all three color beams within the composite beam. This allows the optically coupled circuit boards in the arrangement of FIG. 5 to function as a matrix switch having a plural inputs and outputs. The optical switch configuration is capable of operating as a mesh, or fabric, switch in selectively combining the color coded beams emitted by each of the circuit boards.

All of the inventive embodiments described above rely on free space optics to transmit signals between the circuit boards in an equipment shelf. There are no special backplane connection requirements in the equipment shelf, nor are modifications to standard backplane connections required. Thus, industry standard backplanes such as the Compaq PCI Backplane can be used without modification. The use of free space optics to transmit signals between circuit boards requires no other physical connections to establish data links between the circuit boards. Thus, removing and replacing circuit boards requires no additional hardware manipulation. Because of the very high data rates available with light beams such as provided by lasers and other optical transmission techniques, the data link between circuit boards has a very high bandwidth. In addition, when a circuit board is removed from the backplane circuit board in an equipment shelf, the communication links to that board are automatically removed and the other circuit boards can continue to communicate with one another with no, or very little, interruption in the data stream between the circuit boards. Since communication between circuit boards is via an optical link, a large variety of protocols and types of data may be carried over that link to provide the inventive circuit board communication arrangement with great flexibility.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawing is offered by way of illustration only and not as a limitation. The actual scope of the invention is intended to be defined in the following claims when viewed in their proper perspective based on the prior art.

We claim:

1. A matrix switch having plural input signals, plural output signals and plural nodes for converting said input signals to said output signals, said matrix switch comprising;
   plural input signal sources disposed on each circuit board for providing respective input signals, wherein each of said input signal sources includes signal generating circuitry coupled to an optical transmitter for converting each of said input signals to an associated light beam;
   a common beam path along which each of said light beams is directed by a respective optical transmitter; and
   plural output signal sources disposed on each circuit board, wherein the input and output signal source on each circuit board have associated therewith an optical combiner/splitter disposed in and aligned with said common beam path for receiving said light beams wherein each of said output signal sources includes signal receiving circuitry coupled to an optical receiver for converting each of said light beams to a respective output signal, and wherein each of said input signal sources on each circuit board can simultaneously communicate with any of said output signal sources on any other circuit board or on its associated circuit board via a respective light beam, and wherein light beams are directed in first and second opposed directions along said common beam path.

2. The matrix switch of claim 1 wherein each of said circuit boards is generally planar and is electrically connected to a backplane circuit board, and wherein said circuit boards are aligned generally parallel.

3. A matrix switch having plural input signals, plural output signals and plural nodes for converting said input signals to said output signals, said matrix switch comprising;
   plural input signal sources disposed on each circuit board for providing respective input signals, wherein each of said input signal sources includes signal generating circuitry coupled to an optical transmitter for converting each of said input signals to an associated light beam;
   a common beam path along which each of said light beams is directed by a respective optical transmitter;
   plural output signal sources disposed on each circuit board, wherein the input and output signal sources on each circuit board have associated therewith an optical combiner/splitter disposed in and aligned with said common beam path for receiving said light beams wherein each of said output signal sources includes signal receiving circuitry coupled to an optical receiver for converting each of said light beams to a respective output signal, and wherein each of said input signal sources can communicate with any of said output signal sources via a respective light beam; and
   plural apertures each disposed in a respective circuit board and aligned with said common beam path for passing light beams transmitted between said circuit boards.

4. The matrix switch of claim 3 wherein each optical combiner/splitter disposed on each of said circuit boards and aligned with said common beam path combines an optical beam provided by an optical transmitter on its associated circuit board with other optical beams in said common beam path and reflects a light beam directed along said common beam path to an optical receiver on its associated circuit board.

5. A matrix switch having plural input signals, plural output signals and plural nodes for converting said input signals to said output signals, said matrix switch comprising;
   plural input signal sources disposed on each circuit board for providing respective input signals, wherein each of said input signal sources includes signal generating circuitry coupled to an optical transmitter for converting each of said input signals to an associated light beam;
   a common beam path along which each of said light beams is directed by a respective optical transmitter;
   plural output signal sources disposed on each circuit board with an associated input signal source for receiving said light beams wherein each of said output signal sources includes signal receiving circuitry coupled to an optical receiver for converting each of said light beams to a respective output signal, and wherein each of said input signal sources can communicate with any of said output signal sources via a respective light beam;

an optical combiner/splitter disposed on each of said circuit boards and aligned with said common beam path for combining an optical beam provided by an optical transmitter on its associated circuit board with other optical beams in said common beam path and for reflecting a light beam directed along said common beam path to an optical receiver on its associated circuit board; and plural apertures each disposed in a respective circuit board and aligned with said common beam path for passing light beams transmitted between said circuit boards, wherein each aperture on a given circuit board is disposed adjacent an optical combiner/splitter on said given circuit board, and wherein the combination of an aperture and an optical combiner/splitter is aligned with an optical transmitter and optical receiver on said given circuit board.

6. The matrix switch of claim 5 wherein each of said light beams has a different frequency.

7. The matrix switch of claim 5 wherein said light beams are color coded.

* * * * *